(12) United States Patent
Sa

(10) Patent No.: US 7,303,967 B2
(45) Date of Patent: Dec. 4, 2007

(54) METHOD FOR FABRICATING TRANSISTOR OF SEMICONDUCTOR DEVICE

(75) Inventor: Seung Hoon Sa, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/874,932

(22) Filed: Jun. 23, 2004

(65) Prior Publication Data

US 2005/0112835 A1    May 26, 2005

(30) Foreign Application Priority Data

Nov. 26, 2003   (KR)  .................. 10-2003-0084314

(51) Int. Cl.
- *H01L 21/336* (2006.01)
- *H01L 21/3205* (2006.01)
- *H01L 21/4763* (2006.01)

(52) U.S. Cl. .............. 438/308; 438/305; 438/206; 438/558; 438/520; 438/525; 438/585; 438/595; 257/E21.135; 257/E21.136; 257/E21.137; 257/E21.138; 257/E21.139; 257/E21.14; 257/E21.141; 257/E21.142; 257/E21.143; 257/E21.144; 257/E21.145; 257/E21.146; 257/E21.147; 257/E21.148; 257/E21.149; 257/E21.15; 257/E21.151; 257/E21.152; 257/E21.153

(58) Field of Classification Search .............. 438/520, 438/525, 585, 595, 308, 305, 558; 257/E21.135, 257/E21.136, E21.137, E21.138, E21.139, 257/E21.14, E21.141, E21.142, E21.143, 257/E21.144, E21.145, E21.146, E21.147, 257/E21.148, E21.149, E21.15, E21.151, 257/E21.152, E21.153

See application file for complete search history.

(56) References Cited

U.S. PATENT DOCUMENTS

| | | | |
|---|---|---|---|
| 6,030,874 A | 2/2000 | Grider et al. | |
| 6,358,807 B1 | 3/2002 | Chyan et al. | |
| 6,437,406 B1 * | 8/2002 | Lee | 438/520 |
| 6,514,833 B1 | 2/2003 | Ishida et al. | |
| 6,803,636 B2 * | 10/2004 | Ibara et al. | 257/412 |
| 2005/0109608 A1 * | 5/2005 | Su | 204/192.15 |

FOREIGN PATENT DOCUMENTS

KR    2001-0087474    9/2001

* cited by examiner

*Primary Examiner*—Walter L. Lindsay, Jr.
(74) *Attorney, Agent, or Firm*—Ladas & Parry LLP

(57) ABSTRACT

Disclosed is a method for fabricating a transistor of a semiconductor device, the method comprising the steps of: providing a semiconductor; forming a gate electrode; performing a low-density ion implantation process with respect to the substrate, thereby forming an LDD ion implantation layer; forming an insulation spacer on a sidewall of the gate electrode; forming a diffusion barrier; performing a high-density ion implantation process with respect to the substrate, thereby forming a source/drain; performing a first thermal treatment process with respect to a resultant structure, so as to activate impurities in the source/drain, and simultaneously causing a diffusion velocity of the impurities in the source/drain to be reduced by the diffusion barrier; and forming a salicide layer.

19 Claims, 4 Drawing Sheets

METHOD FOR FABRICATING TRANSISTOR OF SEMICONDUCTOR DEVICE

BACKGROUND OF THE INVENTION

1. Field of the Invention

The present invention relates to a method for fabricating a semiconductor device, and more particularly to a method for fabricating a transistor of a semiconductor device, which can improve a short channel effect by reducing a diffusion velocity of boron ions in a PMOS device.

2. Description of the Prior Art

Recently, multimedia systems capable of simultaneously representing image, voice, character, etc., have been required to be fabricated with a compact size and a light weight, while being equipped with various kinds of complicated and advanced functions. In order to satisfy this demand, one-chip technology, which integrates semiconductor circuits having mutually different functions on the same chip so as to form one system, has been studied and developed.

In a semiconductor circuit integrated on one chip, a plurality of circuits having different functions and operating at different voltages from each other have to be formed on the same semiconductor substrate, while maintaining the respective original functions. That is, the construction of transistors having different driving voltages from each other are required to be provided on the same semiconductor substrate. To this end, it is necessary to control threshold voltages of devices such that the devices have different values from each other.

In a case of a predetermined article requiring different operational voltages between an input/output terminal portion and a core portion, in which a logic is actually carried out, such a demand has been satisfied by a dual gate oxide layer forming process. An object of the present invention is to simplify the above-mentioned processes as a single process while reducing a fabricating cost.

According to the prior art, in fabricating a device which requires different operational voltages from each other in one chip, a dual gate oxide process is employed so as to form gate oxide layers having different thicknesses. That is, according to the prior art, after an initial oxidation process is performed with respect to a semiconductor substrate, one side portion of an oxide layer is removed, and simultaneously the thickness of the oxide layer remaining on the other side portion is lowered. After this, a re-oxidation process is performed to grow an oxide layer on both of the portions, thereby forming oxide layers having different thicknesses from each other in one chip.

FIGS. 1A to 1E are sectional views for explaining the conventional method of fabricating a transistor of a semiconductor device, with a PMOS FET as an example.

According to the conventional method of fabricating a transistor of a semiconductor device, as shown in FIG. 1A, first, a semiconductor substrate 1 is provided in which the semiconductor substrate 1 has been divided into an active region (not shown) of a device and an isolation region (not shown). Subsequently, a shallow trench isolation (STI) process well-known in the art is performed to form a trench 2 and an isolation layer 3 for filling the trench 2 in sequence.

Next, as shown in FIG. 1B, ions are implanted into the active region of the substrate including the isolation layer 3 according to channel types of transistors, thereby forming a well 4.

Then, as shown in FIG. 1C, a silicon oxide layer and a poly-crystal silicon layer are sequentially deposited on the substrate including the well 4, and then are selectively etched, thereby forming a gate oxide layer 5 and a gate electrode 6, respectively.

After this, a low-density ion implantation process is performed with respect to the substrate using the gate electrode 6 as a mask, thereby forming an LDD (Lightly Doped Drain) ion implantation layer 7 for forming a source/drain at both side portions of the gate electrode 6.

Subsequently, as shown in FIG. 1D, a first insulation spacer 9 and a second insulation spacer 10 are formed on sidewalls of the gate electrode 6. Herein, the first insulation spacer 9 is formed with an LP-TEOS (Low Pressure Tetra Ethyl Ortho Silicate) layer to serve as a buffer layer, and the second insulation spacer 10 is formed with a silicon nitride layer.

Next, a high-density ion implantation process is performed with respect to the substrate, using the gate electrode 6 including the first and second insulation spacers 9 and 10 as a mask, thereby forming a high-density ion implantation layer 11, which is the source/drain, at a side portion of the second insulation spacer 10. Then, a rapid thermal treatment process (not shown) is performed at a temperature of 950° C. or more, thereby activating implanted impurities. Ions used for the ion implantation process for forming the high-density ion implantation layer 11 may include boron.

After this, as shown in FIG. 1E, in order to reduce a contract resistance, a salicide layer 12 is formed on upper surfaces of the gate electrode 6 and the high-density ion implantation layer 11, which is the source/drain, thereby fabricating a transistor. Herein, according to a process for forming the salicide layer 12, cobalt is deposited as metal material on an entire upper surface of the substrate, a thermal treatment process is performed, and then, unreacted metal material is removed.

However, according to the prior art, as the size of semiconductor devices becomes reduced, if boron is implanted into the source/drain as a source in a case of a PMOSFET, diffusion velocity of ions is so fast that local doping may not be achieved and a junction depth of the source/drain may be increased. In addition, boron is diffused towards a channel, thereby causing a short channel effect, lowering a threshold voltage when the device is driven. Thus, the prior art has a problem in that the performance of the device is deteriorated.

SUMMARY OF THE INVENTION

Accordingly, the present invention has been made to solve the above-mentioned problems occurring in the prior art, and an object of the present invention is to provide a method for fabricating a transistor of a semiconductor device, which can improve a short channel effect by reducing the diffusion velocity of boron ions by implanting carbon ions having higher diffusion velocity than boron ions over a range including a source/drain region before a boron ion implantation process for forming a source/drain is performed in such a manner that the diffusion of carbon ions takes the place of the diffusion of boron ions.

In order to accomplish this object, there is provided a method for fabricating a transistor of a semiconductor device, the method comprising the steps of: providing a semiconductor substrate including an isolation layer and a well; forming a gate electrode by interposing a gate oxide layer between the substrate and the gate electrode; performing a low-density ion implantation process with respect to the substrate using the gate electrode as a mask, thereby forming an LDD ion implantation layer; forming an insulation spacer on a sidewall of the gate electrode; performing the ion implantation process with respect to the substrate using the gate electrode including the insulation spacer as a mask, thereby forming a diffusion barrier; performing a high-density ion implantation process with respect to the substrate using the gate electrode including the insulation spacer as a mask, thereby forming a source/drain; performing a first thermal treatment process with respect to a resultant structure including the source/drain, so as to activate impurities in the source/drain, and simultaneously causing a diffusion velocity of the impurities in the source/drain to be reduced by the diffusion barrier; and depositing a metal layer on the substrate, which passes through the first thermal treatment process, and performing a second thermal treatment process, thereby forming a salicide layer.

It is preferred that the ion implantation process for forming the diffusion barrier is performed by implanting carbon ions, under process conditions of ion energy of 10 to 35 keV and an ion dosage of 1.0E14 to 5.0E15 atoms/cm$^2$. In this case, the ion dosage is performed by two to four times. In addition, the ion implantation process for forming the diffusion barrier is performed with a tilt angle of 10° to 30° and a twist angle of 1° to 360°.

Also, it is preferred that the ion implantation process for forming the source/drain is performed by implanting boron ions, under process conditions of ion energy of 0.5 to 10 keV and an ion dosage of 2.0E15 to 5.0E15 atoms/cm$^2$. In this case, the ion implantation process for forming the source/drain is performed with a tilt angle of 0 to 30° and a twist angle of 0 to 360°.

In addition, it is preferred that the second thermal treatment process is performed at a temperature of about 900 to 1050° C. for 10 to 30 seconds, with a process chamber maintained in a 100% nitrogen atmosphere. In this case, the second thermal treatment process is performed by increasing a temperature in a rate of 30 to 50° C./sec.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
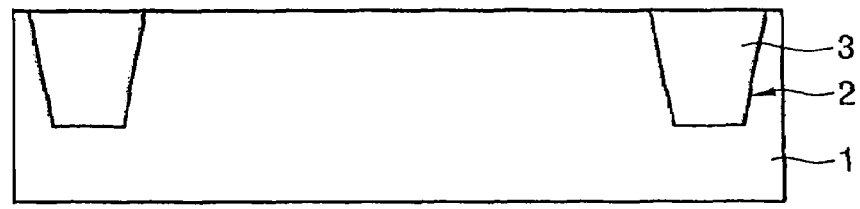
FIGS. 1A to 1E are sectional views for explaining the conventional method of fabricating a transistor of a semiconductor device, with a PMOS FET as an example.
Figure 1B:
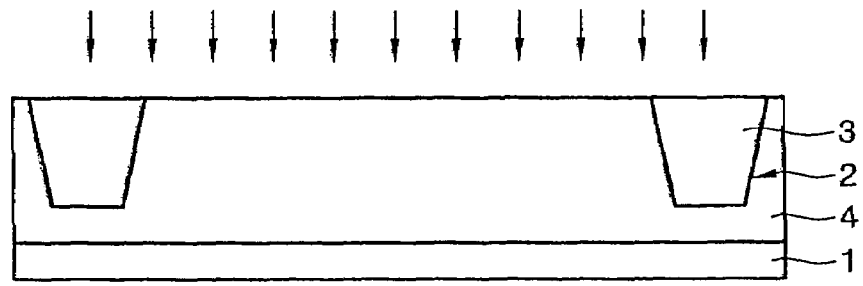
Figure 1C:
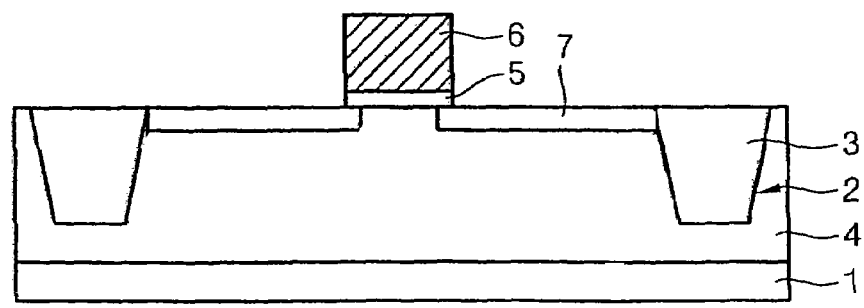
Figure 1D:
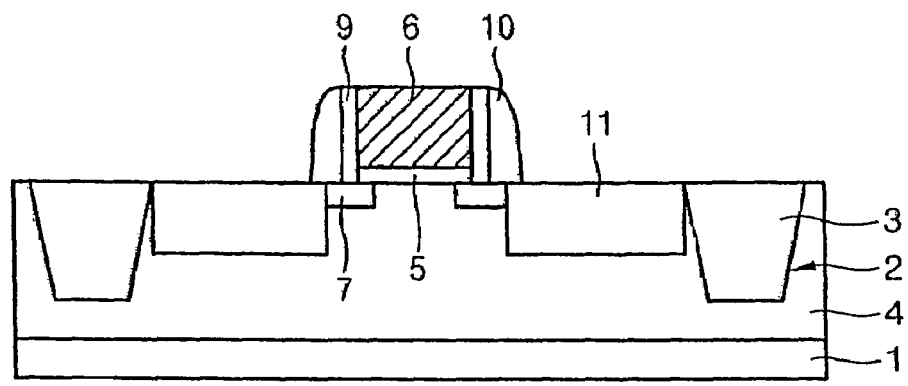
Figure 1E:
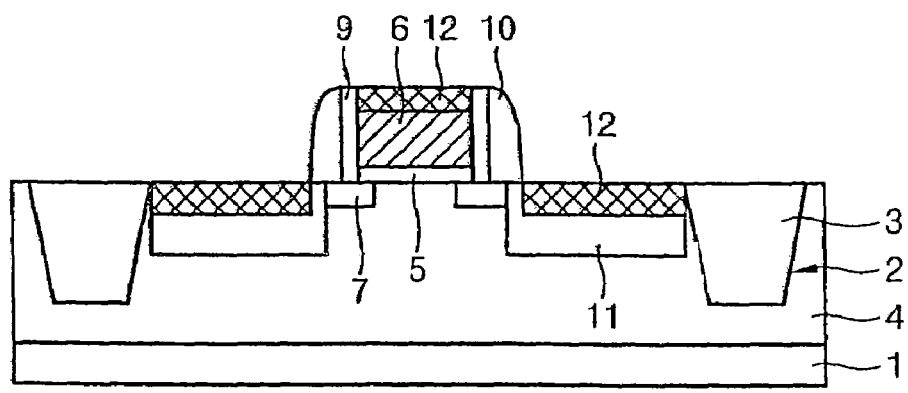

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 2A to 2G are sectional views for explaining a method of fabricating a transistor of a semiconductor device, with a PMOS FET as an example, according to one embodiment of the present invention.

Figure 2A:
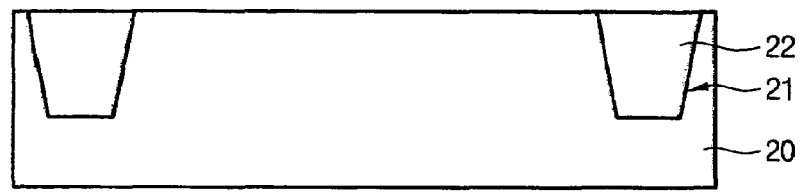
FIGS. 2A to 2G are sectional views for explaining a method of fabricating a transistor of a semiconductor device, with a PMOS FET as an example, according to one embodiment of the present invention.

According to a method of fabricating a transistor of a semiconductor device according to the present invention, as shown in FIG. 2A, first, a semiconductor substrate 20 is provided in which the semiconductor substrate 20 has been divided into an active region (not shown) of the device and an isolation region (not shown). Subsequently, a shallow trench isolation (STI) process well-known in the art is performed to form an isolation layer 22 in the substrate 20. Herein, reference numeral 21 represents a trench.

Figure 2B:
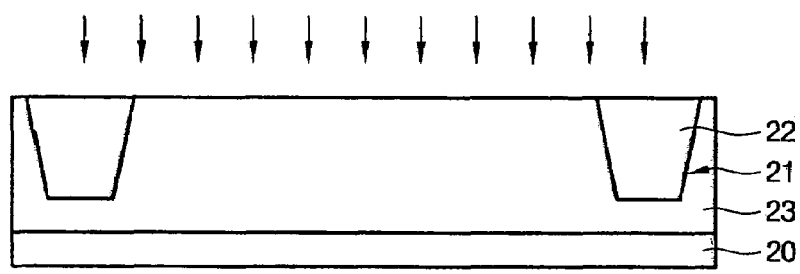

Next, as shown in FIG. 2B, ions are implanted into the active region of the substrate including the isolation layer 22 according to types of transistors, thereby forming a first conductive well 23. Herein, it is possible to inverse the order of the isolation layer forming process and the well forming process.

Then, although it is not shown in the accompanying drawings, in order to control a threshold voltage of a transistor, a channel ion implantation process is performed to implant impurities, thereby forming a channel ion implantation layer up to a predetermined depth in the well. Through this process, an n-type well, a p-type well, and an ion implantation layer are formed, and then, a thermal treatment process is performed so as to activate the implanted impurities.

Figure 2C:
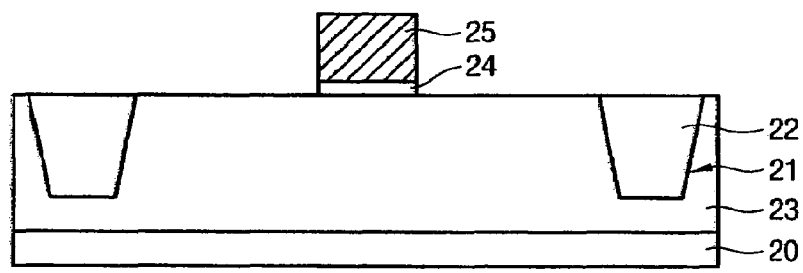

After this, as shown in FIG. 2C, a silicon oxide layer and a poly-crystal silicon layer are sequentially deposited on the substrate including the well 23, and then are selectively etched, thereby forming a gate oxide layer 24 and a gate electrode 25, respectively.

Figure 2D:
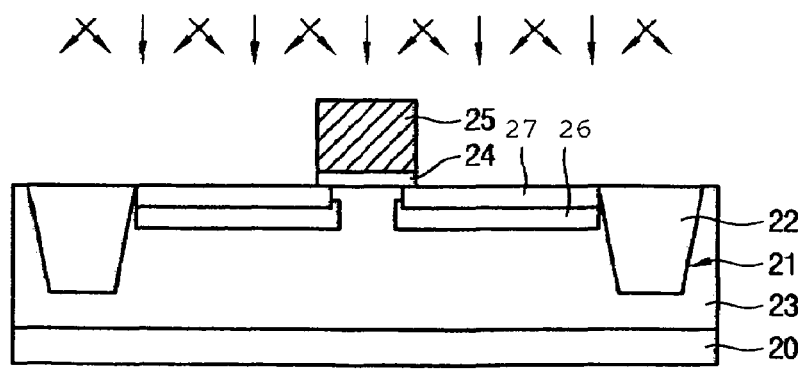

Subsequently, as shown in FIG. 2D, halo ions, for example, germanium (Ge) ions, are ion-implanted using the gate electrode 25 as a mask, thereby forming a halo ion implantation layer 26 on an exposed active region of the semiconductor substrate.

Next, a low-density ion implantation process is performed with respect to the substrate including the halo ion implantation layer 26 by using again the gate electrode 25 as a mask, thereby forming an LDD (Lightly Doped Drain) ion implantation layer 27 for forming a source/drain at both side portions of the gate electrode 25. The LDD ion implantation layer 27 controls an electric field for carriers flowing between a source and a drain formed through a following process. Such a control minimizes an inappropriate operation phenomenon of the device, which may happen due to undesired flow of carriers caused by a very high electric field concentrated at a part of a channel drain. Herein, such density of the electric field may occur because the operational voltage of the device is not reduced even though the size of the device becomes reduced.

Herein, when the LDD ion implantation layer 27 is formed with an excessive depth, the distance between the source and the drain becomes so short that flow of current occurs in a deep area, so that it may be difficult to drive the device due to a short channel effect. Therefore, it is preferred that the LDD ion implantation layer 27 is formed with a shallower depth than that of the halo ion implantation layer 26.

Figure 2E:
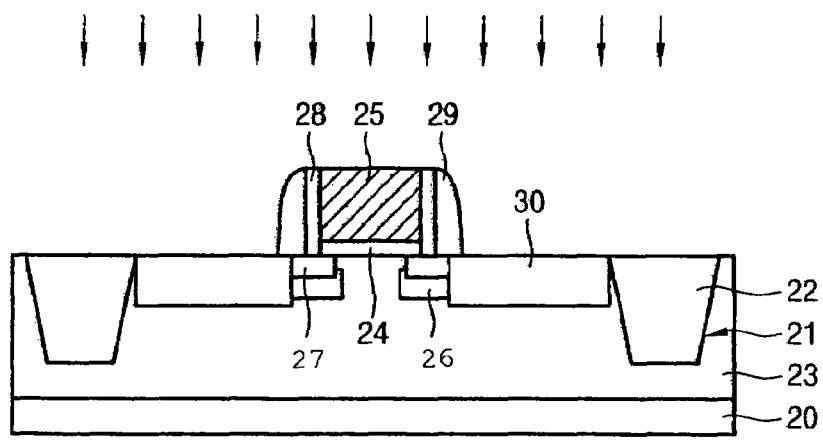

After this, as shown in FIG. 2E, a buffer layer and a silicon nitride (Si$_3$N$_4$) layer are sequentially formed on the entire surface of the gate electrode 25, and then, an etching process is performed with respect to the entire surface of the substrate, thereby forming a first insulation spacer 28 and a second insulation spacer 29 on sidewalls of the gate electrode 25. Herein, the buffer layer is formed with an LP-TEOS (Low Pressure Tetra Ethyl Ortho Silicate) layer, and remains only at an interface between the gate electrode 25 and the second insulation spacer 29 and at an interface between the semiconductor substrate 20 and the second insulation spacer 29.

Next, carbon is ion-implanted into the substrate using the gate electrode 25 including the first and second insulation spacers 28 and 29 as a mask, thereby forming a diffusion barrier 30 on the substrate located below the second insulation spacer 29. In this case, the diffusion barrier 30 is formed at a region for forming the source/drain.

An ion implantation process for forming the diffusion barrier 30 is performed by implanting carbon ions, under process conditions of ion energy of 10 to 35 keV and an ion dosage in a rate of 1.0E14 to 5.0E15 atoms/cm$^2$. The ion dosage is carried out several times, for example two times or four times. In addition, the ion implantation process for forming the diffusion barrier 30 is performed with a tilt angle of 10° to 30° and a twist angle of 1° to 360°.

Meanwhile, the diffusion barrier 30 reduces a diffusion velocity of impurities which are diffused to a channel area from a source/drain area to be formed later. In addition, the diffusion barrier 30 may allow the source/drain to be formed with a shallow junction depth.

Figure 2F:
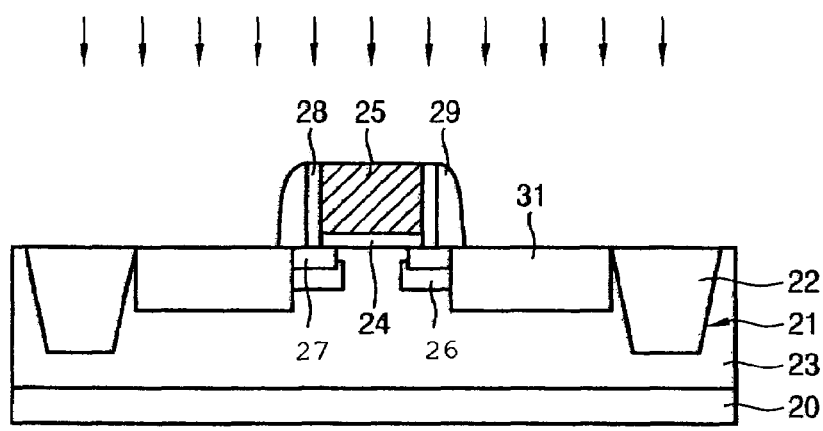

After that, as shown in FIG. 2F, a high-density ion implantation process is performed with respect to the substrate, using the gate electrode 25 including the first and second insulation spacers 28 and 29 as a mask, thereby forming the source/drain 31 in the substrate corresponding to a portion below the second insulation spacer 29. In this case, an ion implantation process for forming the source/drain 31 are performed by implanting boron ions, under process conditions of ion energy of 0.5 to 10 keV and an ion dosage of 2.E15 to 5.0E15 atoms/cm$^2$. In addition, the boron is ion-implanted with a tilt angle of 10° to 30° and a twist angle of 1° to 360°.

After this, a thermal treatment process (not shown) is performed at a temperature of 950° C. or more, thereby activating implanted impurities.

Figure 2G:
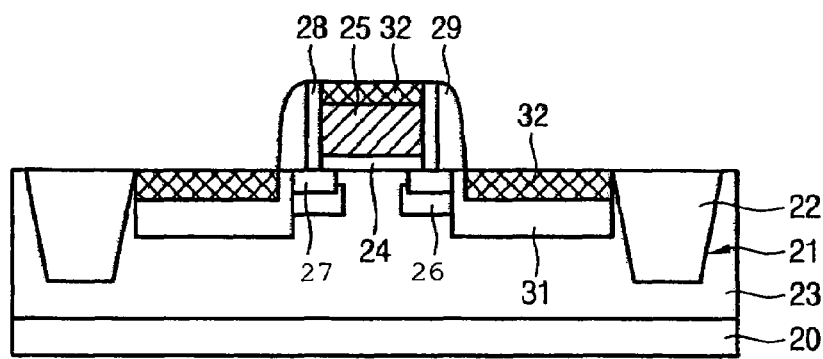

Subsequently, as shown in FIG. 2G, in order to reduce a contract resistance, a salicide layer 32 is formed on upper surfaces of the gate electrode 25 and the high-density source/drain 31, thereby fabricating a transistor. Herein, according to a process for forming the salicide layer 32, a titanium nitride layer (TiN) and a cobalt metal layer are sequentially deposited on an entire upper surface of the substrate, and then, a first rapid thermal treatment process is performed. In this time, cobalt is reacted with silicon through the first rapid thermal treatment, thereby forming a cobalt salicide layer 32. After this, unreacted metal material is removed by means of ammonia solution (NH$_4$OH) and hydrochloric acid, and a second rapid thermal treatment process is performed, thereby completing a self-alignment salicide-process in the region of the source/drain.

As described above, according to a fabricating method of the present invention, before the source/drain is formed, carbon ions are implanted over a range including the region of the source/drain to be formed later so as to form the diffusion barrier. As a result, the diffusion of carbon in the diffusion barrier takes the place of the diffusion of boron ions, thereby reducing the diffusion velocity of the boron ions. Therefore, the junction depth of the source/drain is reduced, thereby improving the short channel effect, which causes a threshold voltage to be lowered as the size of the device becomes smaller. Consequently, a device margin is sufficiently ensured, thereby increasing the performance of the device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a transistor of a semiconductor device, the method comprising the steps of:
   providing a semiconductor substrate including an isolation layer and a well;
   forming a gate electrode by interposing a gate oxide layer between the substrate and the gate electrode;
   performing a low-density ion implantation process with respect to the substrate using the gate electrode as a mask, forming an LDD ion implantation layer;
   forming an insulation spacer on a sidewall of the gate electrode; performing the ion implantation process with respect to the substrate using the gate electrode including the insulation spacer as a mask, forming a diffusion barrier,
   wherein the ion implantation process for forming the diffusion barrier is performed with ion energy of 10 to 35 keV and an ion dosage of 1.0E14 to 5.0E15 atoms/cm$^2$, wherein, the ion implantation process is performed two to four times;
   performing a high-density ion implantation process with respect to the substrate including the diffusion barrier using the gate electrode including the insulation spacer as a mask, forming a source/drain;
   performing a first thermal treatment process with respect to a resultant structure including the source/drain, so as to activate impurities in the source/drain, and simultaneously causing a diffusion velocity of the impurities in the source/drain to be reduced by the diffusion barrier; and
   depositing a metal layer on the substrate, which passes through the first thermal treatment process, and performing a second thermal treatment process, forming a salicide layer.

2. A method for fabricating a transistor of a semiconductor device, the method comprising the steps of:
   providing a semiconductor substrate including an isolation layer and a well;
   forming a gate electrode by interposing a gate oxide layer between the substrate and the gate electrode;
   performing ion implantation respect to the substrate using the gate electrode as a mask, forming a halo ion implantation layer, wherein the halo ion includes Germanium;
   performing a low-density ion implantation process with respect to the substrate using the gate electrode as a mask, forming an LDD (Lightly Doped Drain) ion implantation layer;
   forming an insulation spacer on a sidewall of the gate electrode;
   performing the ion implantation process with respect to the substrate using the gate electrode including the insulation spacer as a mask, forming a diffusion barrier;
   performing a high-density ion implantation process with respect to the substrate including the diffusion barrier using the gate electrode including the insulation spacer as a mask, forming a source/drain;
   performing a first thermal treatment process with respect to a resultant structure including the source/drain, so as to activate impurities in the source/drain, and simultaneously causing a diffusion velocity of the impurities in the source/drain to be reduced by the diffusion barrier; and depositing a metal layer on the substrate, which passes through the first thermal treatment process, and performing a second thermal treatment process, forming a salicide layer.

3. The method as claimed in claim 2, wherein the ion implantation process for forming the diffusion barrier is performed by implanting carbon ions.

4. The method as claimed in claim 2, wherein the ion implantation process for forming the diffusion barrier is performed with ion energy of 10 to 35 keV and an ion dosage of 1.0E14 to 5.0E15 atoms/cm$^2$.

5. The method as claimed in claim 2, wherein the ion implantation process for forming the diffusion barrier is performed with a tilt angle of 10° to 30° and a twist angle of 1° to 360°.

6. The method as claimed in claim 2, wherein the ion implantation process for forming the source/drain is performed by implanting boron ions.

7. The method as claimed in claim 2, wherein the ion implantation process for forming the source/drain is performed with ion energy of 0.5 to 10 keV and an ion dosage of 2.0E15 to 5.0E15 atoms/cm$^2$.

8. The method as claimed in claim 2, wherein the ion implantation process for forming the source/drain is performed with a tilt angle of 0° to 30° and a twist angle of 0° to 360°.

9. The method as claimed in claim 2, wherein the second thermal treatment process is performed at a temperature of about 900 to 1050° C. for 10 to 30 seconds.

10. The method as of aimed in claim 2, wherein the second thermal treatment process is performed by maintaining a process chamber in a 100% nitrogen atmosphere.

11. The method as claimed in claim 2, wherein the second thermal treatment process is performed by increasing a temperature in a rate of 30 to 50° C./sec.

12. The method as claimed in claim 2, wherein the LDD ion implantation layer is formed with a shallower depth than that of the halo ion implantation layer.

13. A method for fabricating a transistor of a semiconductor device, the method comprising the steps of:
   providing a semiconductor substrate including an isolation layer and a well;
   forming a gate electrode by interposing a gate oxide layer between the substrate and the gate electrode;
   performing ion implantation respect to the substrate using the gate electrode as a mask, forming a halo ion implantation layer;
   performing a low-density ion implantation process with respect to the substrate using the gate electrode as a mask, forming an LDD (Lightly Doped Drain) ion implantation layer, wherein the thickness of the LDD ion implantation layer is less than the thickness of the halo ion implantation layer;
   forming an insulation spacer on a sidewall of the gate electrode;
   performing the ion implantation process with respect to the substrate using the gate electrode including the insulation spacer as a mask, forming a diffusion barrier;
   performing a high-density ion implantation process with respect to the substrate including the diffusion barrier using the gate electrode including the insulation spacer as a mask, forming a source/drain;
   performing a first thermal treatment process with respect to a resultant structure including the source/drain, so as to activate impurities in the source/drain, and simultaneously causing a diffusion velocity of the impurities in the source/drain to be reduced by the diffusion barrier; and
   depositing a metal layer on the substrate, which passes through the first thermal treatment process, and performing a second thermal treatment process, forming a salicide layer.

14. The method as claimed in claim 13, wherein halo ion implantation uses Germanium as halo ions.

15. The method as claimed in claim 13, wherein the insulation spacer comprising a buffer layer and a silicon nitride layer.

16. The method of as claimed in claim 13 wherein the buffer layer is formed with LP-TEOS (Low Pressure-Tetra Ethyl Ortho Silicate) and the silicon nitride layer having a nominal stochiometric formula of $Si_3N_4$.

17. The method of as claimed in claim 13 wherein the silicon nitride layer having a nominal stochiometric formula of $Si_3N_4$.

18. The method as claimed in claim 13 wherein the depositing a metal layer on the substrate forming the salicide layer comprises sequentially depositing on an entire upper surface of the substrate a titanium nitride layer (TiN) and a cobalt metal layer.

19. The method as claimed in claim 13, wherein, the second thermal treatment process is performed by maintaining the process chamber in about 100% nitrogen atmosphere.

* * * * *